(12) United States Patent
Hou et al.

(10) Patent No.: US 9,299,624 B2
(45) Date of Patent: Mar. 29, 2016

(54) STACKED SEMICONDUCTOR STRUCTURE AND MANUFACTURING METHOD FOR THE SAME

(71) Applicant: United Microelectronics Corp., Hsinchu (TW)

(72) Inventors: Hsin-Ming Hou, Tainan (TW); Ji-Fu Kung, Taichung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/159,657

(22) Filed: Jan. 21, 2014

(65) Prior Publication Data

US 2015/0206810 A1    Jul. 23, 2015

(51) Int. Cl.
| H01L 21/66 | (2006.01) |
|---|---|
| H01L 25/07 | (2006.01) |
| H01L 25/00 | (2006.01) |
| H01L 23/538 | (2006.01) |

(52) U.S. Cl.
CPC .............. *H01L 22/32* (2013.01); *H01L 22/14* (2013.01); *H01L 23/5382* (2013.01); *H01L 23/5384* (2013.01); *H01L 23/5386* (2013.01); *H01L 25/074* (2013.01); *H01L 25/50* (2013.01); *H01L 2924/0002* (2013.01)

(58) Field of Classification Search
USPC ........................................................ 257/774
IPC ................................................ H01L 23/5226
See application file for complete search history.

(56) References Cited

U.S. PATENT DOCUMENTS

| 5,894,170 | A | * | 4/1999 | Ishikawa | 257/775 |
|---|---|---|---|---|---|
| 6,046,909 | A | * | 4/2000 | Joy | 361/748 |
| 6,627,824 | B1 | * | 9/2003 | Lin | 174/268 |
| 7,214,615 | B2 | * | 5/2007 | Miyazawa | 438/667 |
| 8,344,512 | B2 | | 1/2013 | Knickerbocker | |
| 8,637,989 | B2 | * | 1/2014 | Lee et al. | 257/773 |
| 2013/0178082 | A1 | | 7/2013 | Hashimoto et al. | |
| 2013/0237054 | A1 | | 9/2013 | Farooq et al. | |

OTHER PUBLICATIONS

Chien-Li Kuo et al, U.S. Appl. No. 14/025,843, filed Sep. 13, 2013.

\* cited by examiner

*Primary Examiner* — Eugene Lee
(74) *Attorney, Agent, or Firm* — WPAT, PC; Justin King (57) ABSTRACT

A stacked semiconductor structure and a manufacturing method for the same are provided. The stacked semiconductor structure is provided, which comprises a first semiconductor substrate, a second semiconductor substrate, a dielectric layer, a trench, a via, and a conductive structure. The first semiconductor substrate comprises a first substrate portion and a first conductive layer on an active surface of the first substrate portion. The second semiconductor substrate comprises a second substrate portion and a second conductive layer on an active surface of the second substrate portion. The trench passes through the second substrate portion and exposing the second conductive layer. The via passes through the dielectric layer and exposes the first conductive layer. The conductive structure has an upper portion filling the trench and a lower portion filling the via. Opposing side surfaces of the upper portion are beyond opposing side surfaces of the lower portion.

6 Claims, 9 Drawing Sheets

STACKED SEMICONDUCTOR STRUCTURE AND MANUFACTURING METHOD FOR THE SAME

BACKGROUND

1. Technical Field

The disclosure relates to a stacked semiconductor structure and a manufacturing method for the same.

2. Description of the Related Art

In the semiconductor technology, the feature size of the semiconductor structure has been reduced. In the meantime, the rate, the efficiency, the density and the cost per integrated circuit unit have been improved. Since critical features of devices have been reduced to a technology limitation, designers have developed a method for improving a device density, using 3D stack structure.

SUMMARY

According to one embodiment, a stacked semiconductor structure is provided, which comprises a first semiconductor substrate, a second semiconductor substrate, a dielectric layer, a trench, a via, and a conductive structure. The first semiconductor substrate comprises a first substrate portion and a first conductive layer on an active surface of the first substrate portion. The second semiconductor substrate comprises a second substrate portion and a second conductive layer on an active surface of the second substrate portion. The dielectric layer is between the first conductive layer and the second conductive layer. The trench passes through the second substrate portion and exposing the second conductive layer. The via passes through the dielectric layer and exposes the first conductive layer. The via is under the trench and communicated with the trench. The conductive structure has an upper portion filling the trench and a lower portion filling the via. Opposing side surfaces of the upper portion are beyond opposing side surfaces of the lower portion.

According to another embodiment, a stacked semiconductor structure is provided, which comprises a first semiconductor substrate, a second semiconductor substrate, circuit regions, and a monitor region. The first semiconductor substrate comprises a first substrate portion and a first conductive layer on an active surface of the first substrate portion. The second semiconductor substrate comprises a second substrate portion and a second conductive layer on an active surface of the second substrate portion. The first semiconductor substrate and the second semiconductor substrate are stacked with the active surfaces facing to each other. The monitor region is between the circuit regions. The monitor region comprises a conductive structure electrically connected to the first conductive layer and/or the second conductive layer and exposed from a back surface of the second substrate portion.

According to yet another embodiment, a stacked semiconductor structure is provided, which comprises a first semiconductor substrate, a second semiconductor substrate, and a second semiconductor substrate. The first semiconductor substrate comprises a first substrate portion and a first conductive layer on an active surface of the first substrate portion. The second semiconductor substrate comprises a second substrate portion and a second conductive layer on an active surface of the second substrate portion. The first semiconductor substrate and the second semiconductor substrate are stacked with the active surfaces thereof facing to each other. The circuit region comprises conductive structures exposed from a back surface of the second substrate portion. The conductive structure has an anti-fuse portion existing between the conductive structure and the first conductive layer and/or the second conductive layer.

According to yet another embodiment, a method for manufacturing a stacked semiconductor structure is provided. The method comprises following steps. A first semiconductor substrate is provided. A second semiconductor substrate is provided. A stacked semiconductor structure is formed by a method comprising stacking the first semiconductor substrate and the second semiconductor substrate. A conductive structure is formed in a monitor region or a circuit region of the stacked semiconductor structure. A monitoring step is performed through the conductive structure in the monitor region, and/or a pairing step is performed through the conductive structure in the circuit regions.

DETAILED DESCRIPTION

Figure 1A:
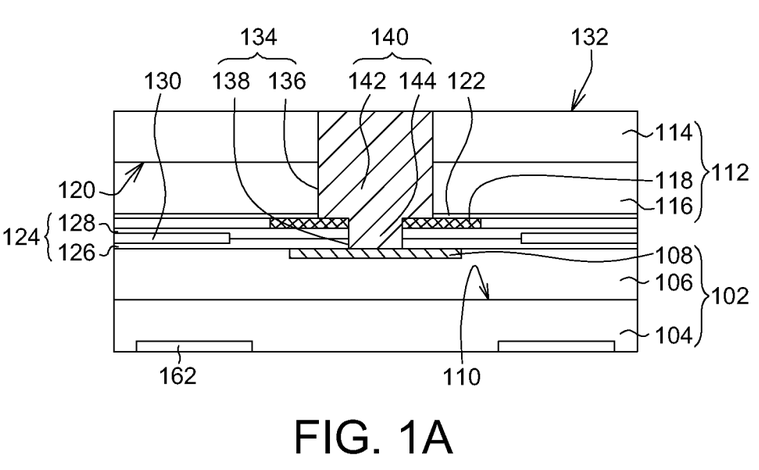
FIG. 1A illustrates a stacked semiconductor structure according to one embodiment.

FIG. 1A illustrates a stacked semiconductor structure and a manufacturing thereof according to one embodiment. A first semiconductor substrate 102 is provided. The first semiconductor substrate 102 may comprise a first substrate portion 104, a first dielectric structure 106 and a first conductive layer 108. The first dielectric structure 106 is formed on an active surface 110 of the first substrate portion 104. The first conductive layer 108 may be formed on or in the first dielectric structure 106.

A second semiconductor substrate 112 is provided. The second semiconductor substrate 112 may comprise a second substrate portion 114, a second dielectric structure 116 and a second conductive layer 118. The second dielectric structure 116 is formed on an active surface 120 of the second substrate portion 114. The second conductive layer 118 may be formed on or in the second dielectric structure 116.

For example, there may be operating device such as active devices such as a memory, a transistor, etc., disposed on the active surfaces 110, 120 of the first substrate portion 104 and the second substrate portion 114. The first dielectric structure 106 and the second dielectric structure 116 may comprise various dielectric films (or dielectric layers) for IC manufactures, such as an etching stop layer 122, or dielectric intermediate layer, etc.

For example, the first conductive layer 108 and the second conductive layer 118 may comprise metal redistributed layer (RDL) that may comprise a conductive trace and a conductive pad, respectively exposed from surfaces the first dielectric structure 106 and the second dielectric structure 116. In one embodiment, the first conductive layer 108 and the second conductive layer 118 are last RDL, but not limited thereto. In other embodiments, other conductive elements may be formed in the first dielectric structure 106 and the second dielectric structure 116.

A dielectric layer 124 may be formed between the first conductive layer 108 and the second conductive layer 118. For example, the dielectric layer 124 may comprise a cap layer 126 of the first semiconductor substrate 102, and a cap layer 128 of the second semiconductor substrate 112, respectively disposed on the first dielectric structure 106 and the first conductive layer 108, and the second dielectric structure 116 and the second conductive layer 118. The cap layers 126 and 128 may be functioned as a protecting layer.

The first dielectric structure 106, the second dielectric structure 116 and the dielectric layer 124 may comprise an oxide, a nitride, an oxynitride, such as silicon oxide, silicon nitride, silicon oxynitride, USG, or other dielectric materials, such as FSG, etc.

The first semiconductor substrate 102 and the second semiconductor substrate 112 may be bounded and stacked by the adhesive layer 130, with the active surfaces 110 120 facing to each other. The adhesive layer 130 may comprise a metal, an insulating material, etc.

After the first semiconductor substrate 102 and the second semiconductor substrate 112 are stacked, a through hole 134 is formed by removing the stacked semiconductor structure from a back surface 132 of the second substrate portion 114. The through hole 134 comprises a trench 136 and a via 138 under the trench 136 and communicated with the trench 136. The trench 136 may pass through the second substrate portion 114 and the second dielectric structure 116, and expose an upper surface of the second conductive layer 118. The via 138 may pass through the dielectric layer 124 and the second conductive layer 118, and expose an upper surface of the first conductive layer 108. The through hole 134 may be formed by a laser method, a lithography method, or other suitable methods. In some embodiments, a flatting step, such as a CMP step, may be performed to the back surface 132 of the second substrate portion 114 before forming the through hole 134.

The through hole 134 is filled with a conductive material to form a conductive structure 140. The conductive structure 140 comprises an upper (conductive) portion 142 formed by filling the trench 136 with the conductive material, and a lower (conductive) portion 144 formed by filling the via 138 with the conductive material. In this embodiment, the upper portion 142 is wider than the lower portion 144. In addition, opposing side surfaces of the upper portion 142 are beyond opposing side surfaces of the lower portion 144. In some embodiments, a barrier layer (not shown) may be formed on exposed surface of the through hole 134 before forming the conductive material. The conductive structure 140 may be formed by an electroplating with forming a seed layer, or other methods, such as a deposition method, etc.

Figure 1B:
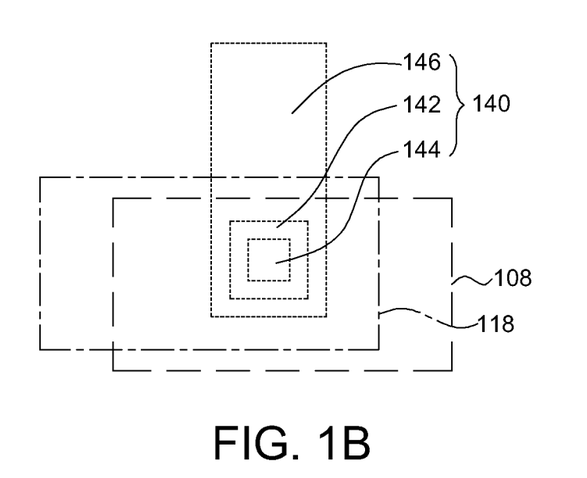
FIG. 1B illustrates a top view of a conductive layer and a conductive structure of a stacked semiconductor structure according to one embodiment.

FIG. 1B illustrates an arrangement for the conductive structure 140, the first conductive layer 108 and the second conductive layer 118 of FIG. 1A according to one embodiment. An top portion of the upper portion 142 of the conductive structure 140 exposed by the second substrate portion 114 (FIG. 1A) may form a conductive redistributed layer (RDL) 146 which may be electrically connected to other conductive elements in other regions. In one embodiment, for example, as observed from the top view, two times an area of the conductive structure 140 in the through hole 134 (FIG. 1A) is smaller than an overlapping area between the first conductive layer 108 and the second conductive layer 118.

According to embodiments, the manufacturing method for the stacked semiconductor structure is simple, and thus can be applied into a wide technique range. For example, the first substrate portion 104 and the second substrate portion 114 are independently a wafer or a chip. For example, the stacked semiconductor structure may comprise a wafer-to-wafer stack, a die-to-die stack, a die-to-wafer stack, or other kinds of stack structures. The stacked semiconductor structure may comprise a homogeneous 3D IC stack; and/or a heterogeneous 3D IC stack combing different technology nodes or different semiconductor materials, etc.

The differences between the stacked semiconductor structure shown in FIG. 2A and the stacked semiconductor structure shown in FIG. 1A are illustrated as follows. A side surface 248 of the upper (conductive) portion 242 and a side surface 250 of the lower (conductive) portion 244 are coplanar. In one embodiment, the via 238 is formed by self-aligning with the second conductive layer 218, and therefore, a side surface 252 of the lower portion 244 of the conductive structure 240 is aligned with an outer edge 254 of the second conductive layer 218.

Figure 2A:
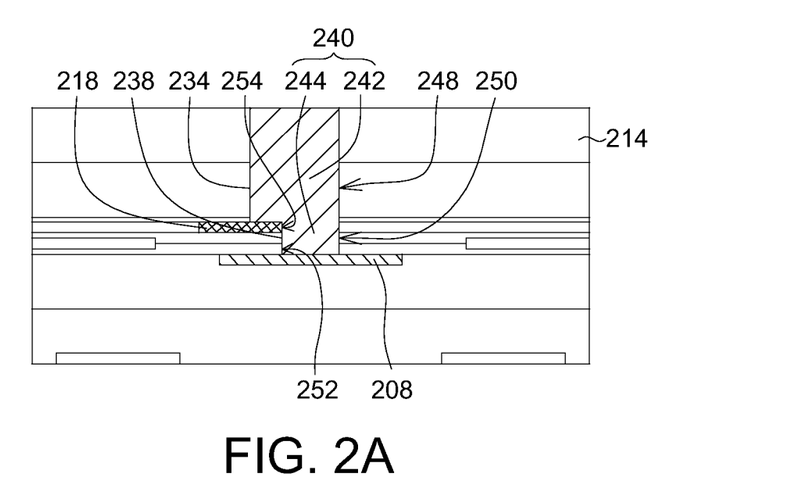
FIG. 2A illustrates a stacked semiconductor structure according to one embodiment.
Figure 2B:
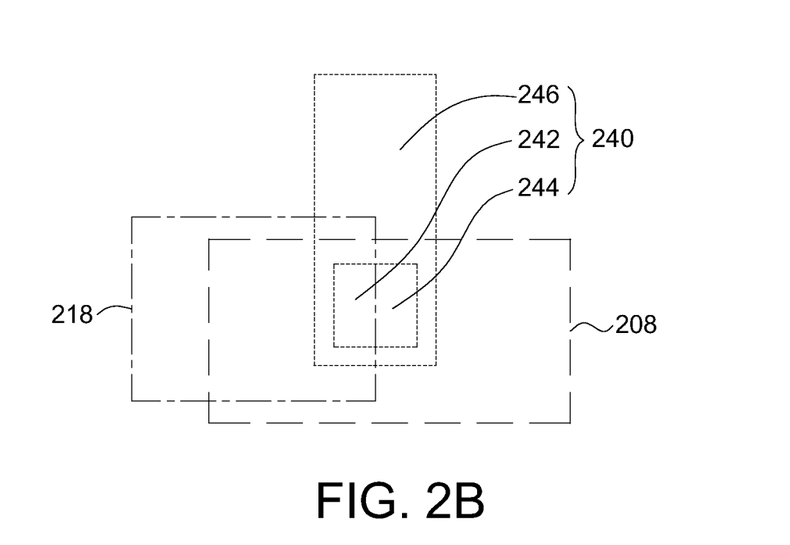
FIG. 2B illustrates a top view of a conductive layer and a conductive structure of a stacked semiconductor structure according to one embodiment.

FIG. 2B illustrates an arrangement for the conductive structure 240, the first conductive layer 208 and the second conductive layer 218 illustrated in FIG. 2A according to one embodiment. The top portion of the upper portion 242 of the conductive structure 240 exposed by the second substrate portion 214 (FIG. 2A) may form the conductive redistributed layer 246 which may be electrically connected to other conductive elements in other regions. In one embodiment, for example, from the top view, an overlapping area between the first conductive layer 208 and the second conductive layer 218 is larger than an area of the conductive structure 240 in the through hole 234 (FIG. 2A), and smaller than two times the area of the conductive structure 240 in the through hole 234.

Differences between the stacked semiconductor structure shown in FIG. 3A between the stacked semiconductor structure shown in FIG. 1A are illustrated as follows. The conductive structure 340 comprises the lower portions 344A, 344B extended down from the upper portion 342. The lower portion 344A is formed by filling the via 338A exposing the first conductive layer 308 with a conductive material. The lower portion 344B is formed by filling the via 338B exposing the second conductive layer 318 with a conductive material. The upper portion 342 is electrically connected to the lower portion 344A and the lower portion 344B.

Figure 3A:
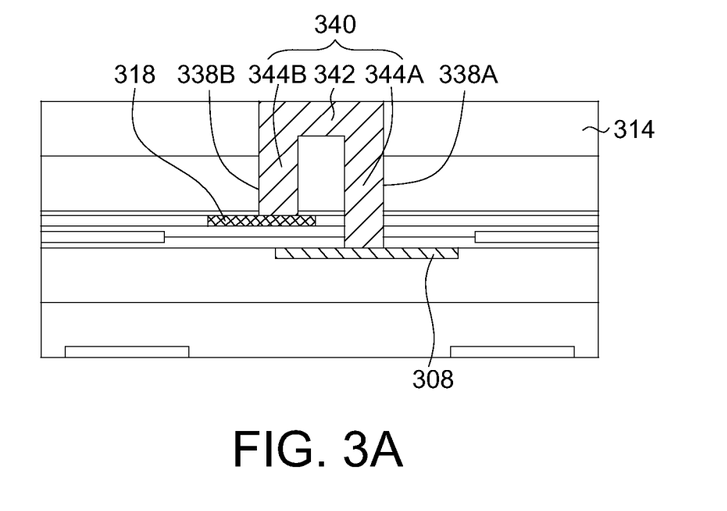
FIG. 3A illustrates a stacked semiconductor structure according to one embodiment.
Figure 3B:
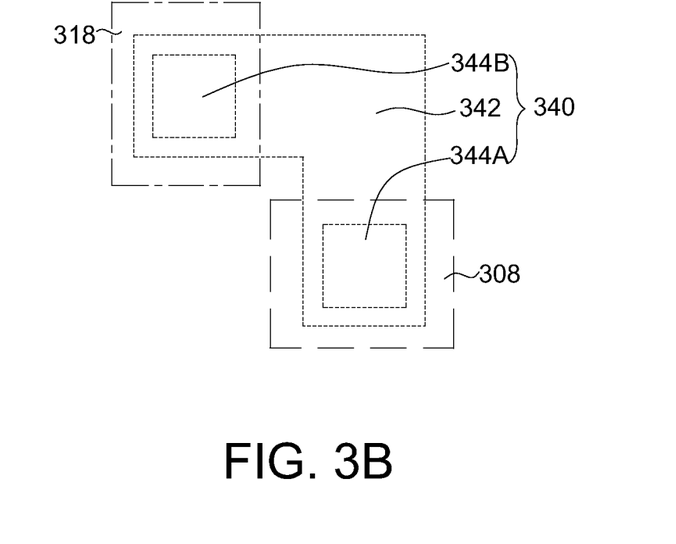
FIG. 3B illustrates a top view of a conductive layer and a conductive structure of a stacked semiconductor structure according to one embodiment.

FIG. 3B illustrates an arrangement for the conductive structure 340, the first conductive layer 308 and the second conductive layer 318 shown in FIG. 3A according to one embodiment. The upper portion 342 of the conductive structure 340 exposed from the second substrate portion 314 (FIG. 2A) may form the conductive redistributed layer which may be extended to electrically connect to other conductive elements in other regions. In one embodiment, for example, in the top view, there is no overlapping between the first conductive layer 308 and the second conductive layer 318.

Figure 4:
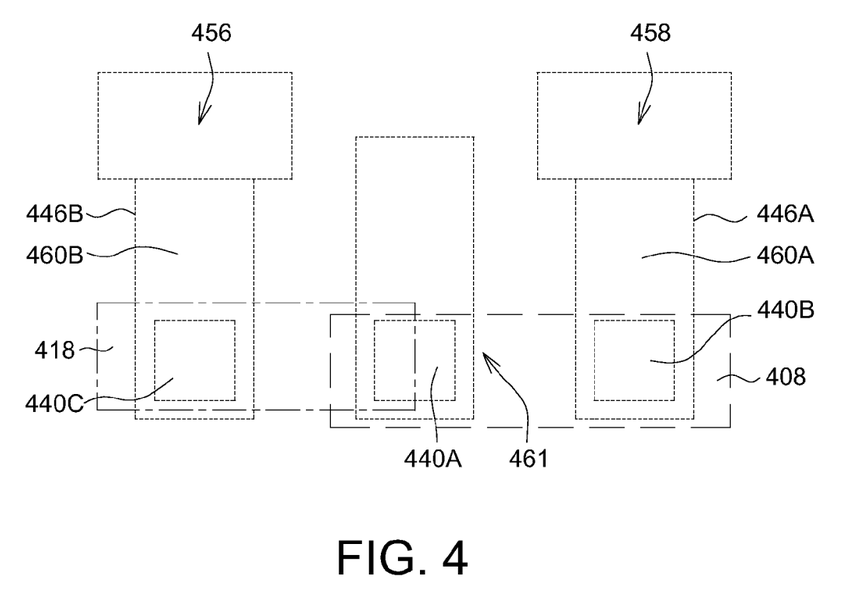
FIG. 4 illustrates a top view of a stacked semiconductor structure according to one embodiment.

FIG. 4 shows the stacked semiconductor structure according to one embodiment, comprising circuit regions 456, 458, and a monitor region 461 between the circuit regions 456 and 458. The conductive structure 440A in the monitor region 461 is electrically connected to the conductive structure in the circuit region 458 through the first conductive layer 408, the conductive structure 440B and the conductive redistributed layer 446A (comprising a probing pad 460A) exposed from the back surface of the second substrate portion (not shown). The conductive structure 440A in the monitor region 461 is electrically connected to the conductive structure in the circuit region 456 through the second conductive layer 418, the conductive structure 440C and the conductive redistributed layer 446B (comprising a probing pad 460B) exposed by the back surface of the second substrate portion. The monitor region 461 and the repairable circuit regions 456 and 458 may be disposed in a blank region outside the device regions (such as active device regions; not shown), such as a region surrounding a chip sealing ring, and therefore make no influence to a density for the operation devices.

The conductive structure 440A in the monitor region 461 may be similar to the conductive structure shown in FIG. 1A, FIG. 2A, or FIG. 3A, and is electrically connected to the first conductive layer 408 and/or the second conductive layer 418. For example, the lower portion 144 of the conductive structure 140 shown in FIG. 1A is electrically and physically connected with the upper surface of the first conductive layer 108, and the upper portion 142 is electrically and physically connected with the upper surface of the second conductive layer 118. The lower portion 144 of the conductive structure 240 shown in FIG. 2A is electrically and physically connected with the upper surface of the first conductive layer 208, and the upper portion 242 is electrically and physically connected with the upper surface of the second conductive layer 218. The lower portion 344A and the lower portion 344B of the conductive structure 340 shown in FIG. 3A are respectively physically and electrically connected with the first conductive layer 408 and the second conductive layer 418.

Referring to FIG. 4, in one embodiment, a monitoring step is performed through the conductive structure 440A in the monitor region 461. For example, in the monitoring step, an electric characteristic may be analyzed to confirm a process or quality for the conductive structure (or the through hole). This monitoring step may be applied to in-line monitoring, increasing monitoring accuracy and yield of a product.

Figure 5A:
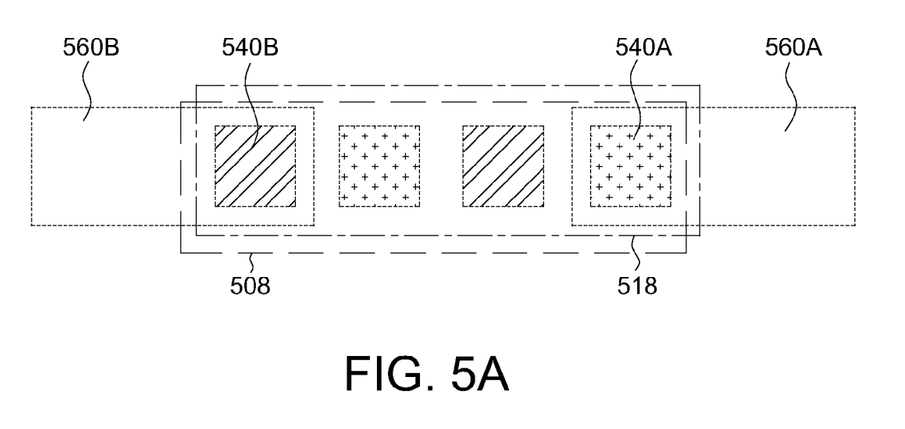
FIG. 5A illustrates a top view of a conductive layer and a conductive structure of a stacked semiconductor structure according to one embodiment.
Figure 5B:
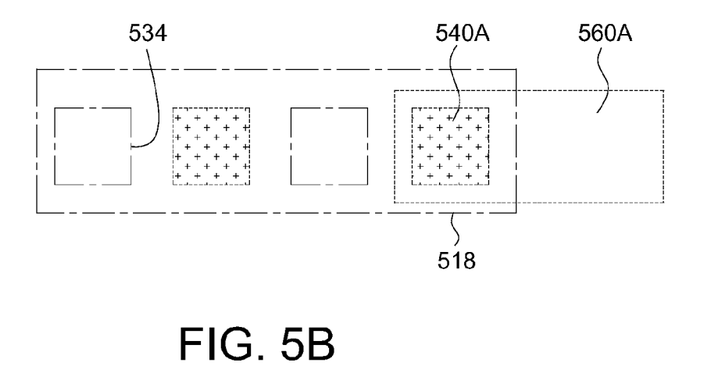
FIG. 5B illustrates a top view of a conductive layer and a conductive structure of a stacked semiconductor structure according to one embodiment.
Figure 5C:
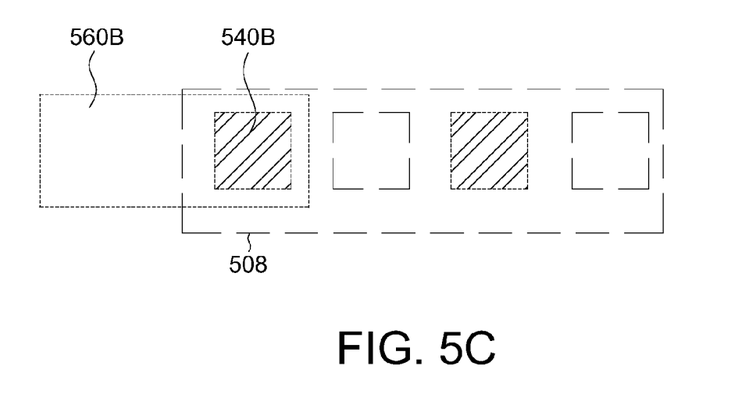
FIG. 5C illustrates a top view of a conductive layer and a conductive structure of a stacked semiconductor structure according to one embodiment.

In one embodiment, in the repairable circuit regions 456, 458, the stacked semiconductor structure may be designed with an arrangement as shown in FIG. 5A, comprising the conductive structures 540A, 540B. FIG. 5B illustrates only the probing pad 560A, the conductive structure 540A and the second conductive layer 518 shown in FIG. 5A. FIG. 5C illustrates only the probing pad 560B, the conductive structure 540B and the first conductive layer 508 shown in FIG. 5A. In one embodiment, the conductive structures 540A, 540B in the circuit regions 456, 458 may be similar with the conductive structure shown in FIG. 1A.

Referring to FIG. 5A and FIG. 5B, for example, the conductive structures 540A separated from each other as a group are electrically insulated from the first conductive layer 508, and can each have an anti-fuse portion in an insulating state between the conductive structure 540A and the second conductive layer 518 so as to electrically insulated from the second conductive layer 518. In one embodiment, a desired condition is that at least on o the conductive structures 540A of the group is electrically connected to the second conductive layer 518. As the monitoring step shows the result that the desired condition of the electrical connecting relation between the conductive structures 540A of the group and the second conductive layer 518 does not exist, a pairing step may be performed to the conductive structures 540A in the circuit regions 456, 458 (FIG. 4). The pairing step may comprise properly selecting another one conductive structure 540A from the conductive structures 540A of the group, and changing the anti-fuse portion of the another one conductive structure 540A from the insulating state into a conductive state, for forming the desired electrical connecting relation, in other words for electrically connecting the another one conductive structure 540A to the second conductive layer 518. Another monitoring step may be performed after the pairing step for confirming if the desired electrical connecting relation is formed. If the relation is not formed, other cycles of the pairing step and the motoring step may be performed to yet another one of the conductive structures 540A of the group, until the test (or monitoring) is passed. The second conductive layer 518 may have the through hole 534 providing the conductive structure 540B (FIG. 5A, FIG. 5C) passing there through to extend down to the underneath first conductive layer 508. The above concept may be applied to the conductive structures 540B of the group and the first conductive layer 508 shown in FIG. 5A and FIG. 5C, and is not described herein.

Figure 6:
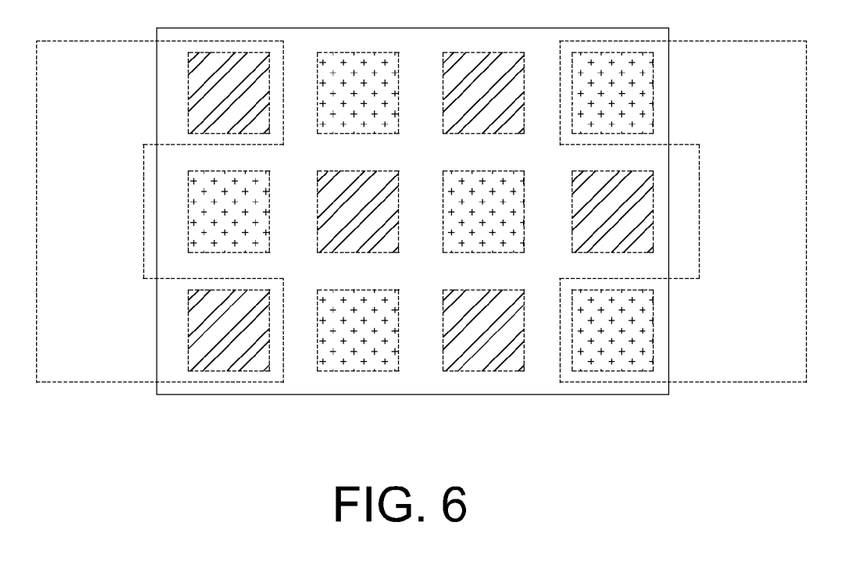
FIG. 6 illustrates a top view of a conductive layer and a conductive structure of a stacked semiconductor structure according to one embodiment.
Figure 7:
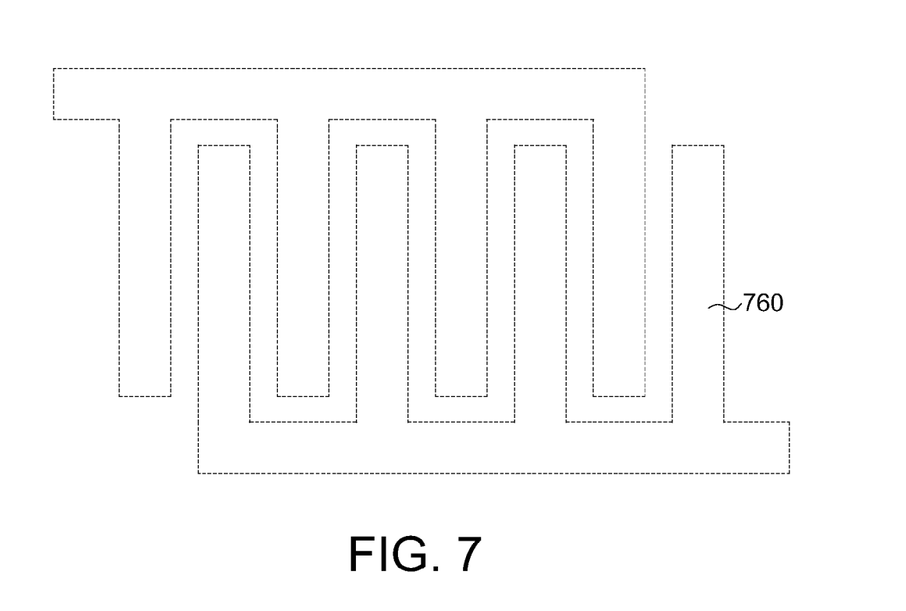
FIG. 7 illustrates a top view of a probing pad according to one embodiment.

The conductive structures in the circuit region are not limited to a one-dimension arrangement as shown in FIG. 5A, and may be arranged in other methods, such as a two-dimensions arrangement as shown in FIG. 6. In one embodiment, the probing pad 760 may have a shape as shown in FIG. However, the disclosure is not limited thereto. The arrange method, the shape, or other structural characteristics may be adjusted according to actual demands.

Figure 8:
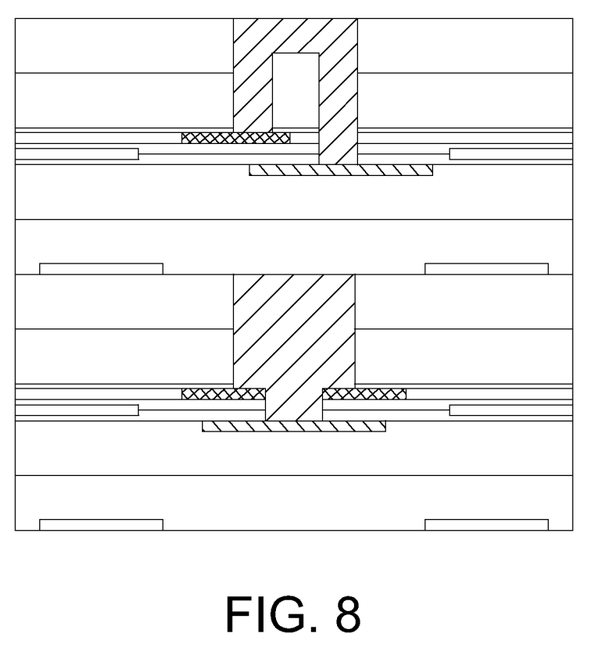
FIG. 8 illustrates a stacked semiconductor structure according to one embodiment.
Figure 9:
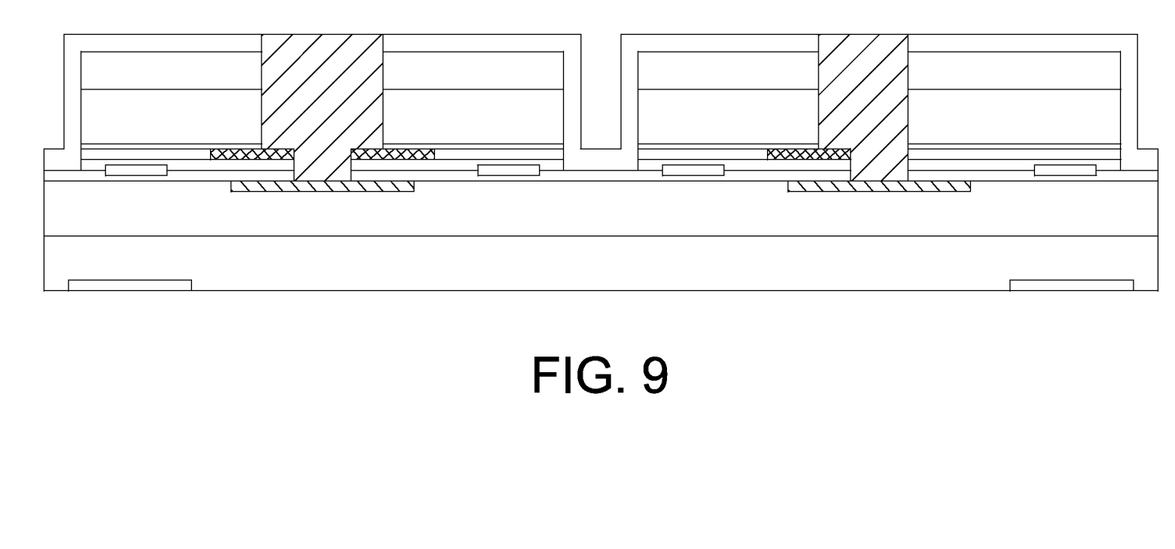
FIG. 9 illustrates a stacked semiconductor structure according to one embodiment.

After the stacked semiconductor structure passes the monitoring step, other succeeding steps may be performed, comprising for example stacking another semiconductor substrate to the stacked semiconductor structure, or a packing process. In some embodiments, for example, stacked semiconductor structure with a further stacked structure may have a vertically-stacked structure as shown in FIG. 8, or a laterally-stacked structure as shown in FIG. 9 such as a wafer semiconductor substrate with chip semiconductor substrates in different regions of the wafer semiconductor substrate. The laterally-stacked structure may be further stacked with another semiconductor substrate to form a vertically-stacked structure. In a case of the further-stacked semiconductor structure, the conductive structure may be formed and the monitoring and/or pairing step may be performed thereto, to check the electrical-connecting relation among the stacked semiconductor substrates, to increase product yield. In some embodiments, after the stacked semiconductor structure with a desired number of stacked semiconductor substrates and before the packing process, other steps may be performed. For example, a metal redistributed layer may be formed, and a testing step may be performed to the device regions such as the active devices regions, etc. In the packing process, a solder ball may be disposed on a conductive pad, such as a conductive pad 162 shown in FIG. 1A, exposed by the stacked semiconductor structure, or the stacked semiconductor structure may be covered by a molding material, or other steps may be performed.

Figure 10:
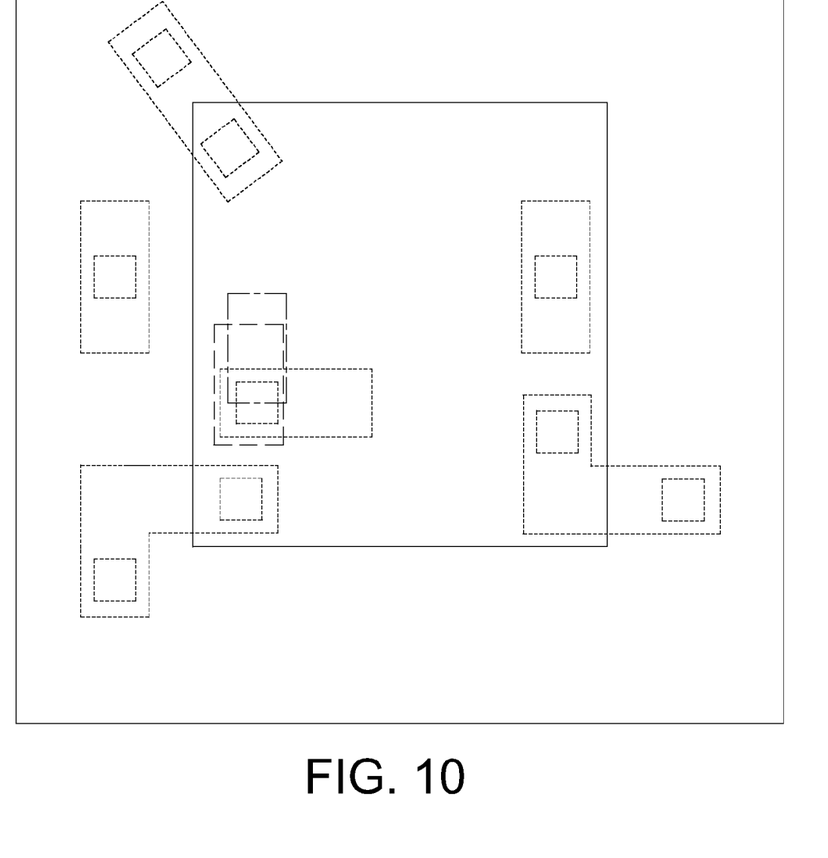
FIG. 10 illustrates a top view of a stacked semiconductor structure according to one embodiment.

In some embodiments, the conductive structures electrically connected to the conductive layer (or the conductive pad) may be designed according to actual demands into an arrangement as shown in FIG. 10, which can replace a conventional complicated wire-bonding technique. The manufacturing method for the conductive structure is simple, and the cost is low.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A stacked semiconductor structure, comprising:
   a first stacked structure comprising a first substrate portion, a first dielectric structure formed on an active surface of the first substrate portion, and a first conductive layer formed on or in the first dielectric structure;
   a second stacked structure comprising a second substrate portion, a second dielectric structure formed under and directly in contact with an active surface of the second substrate portion, and a second conductive layer formed under or in the second dielectric structure;
   a dielectric layer between the first conductive layer and the second conductive layer;
   a trench passing through the second substrate portion and exposing the second conductive layer;
   a via passing through the dielectric layer and exposing the first conductive layer, the via being under the trench and communicated with the trench; and
   a conductive structure having an upper portion filling the trench and a lower portion filling the via, opposing side surfaces of the upper portion being beyond opposing side surfaces of the lower portion, wherein the conductive structure has an anti-fuse portion.

2. The stacked semiconductor structure according to claim 1, wherein the via passes through the second conductive layer.

3. The stacked semiconductor structure according to claim 1, wherein the first substrate portion and the second substrate portion are independently a wafer or a chip.

4. The stacked semiconductor structure according to claim 1, wherein the upper portion of the conductive structure is wider than the lower portion.

5. The stacked semiconductor structure according to claim 1, wherein the lower portion of the conductive structure is electrically and physically connected to an upper surface of the first conductive layer, the upper portion of the conductive structure is electrically and physically connected with an upper surface of the second conductive layer.

6. The stacked semiconductor structure according to claim 1, further comprising an adhesive layer, wherein the dielectric layer comprises a cap layer between the first conductive layer and the second conductive layer, the first stacked structure and the second stacked structure are bounded by the adhesive layer.

* * * * *